United States Patent
Yeh et al.

(10) Patent No.: US 8,575,717 B2
(45) Date of Patent: Nov. 5, 2013

(54) INTEGRATED CIRCUIT DEVICE AND METHOD OF MANUFACTURING THE SAME

(75) Inventors: Der-Chyang Yeh, Hsin-Chu (TW); Shang-Yun Hou, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 13/090,606

(22) Filed: Apr. 20, 2011

(65) Prior Publication Data

US 2012/0267753 A1   Oct. 25, 2012

(51) Int. Cl.
*H01L 29/86* (2006.01)

(52) U.S. Cl.
USPC .......................................... 257/516; 257/528

(58) Field of Classification Search
USPC .................... 257/516, 528, E29.325
See application file for complete search history.

(56) References Cited

U.S. PATENT DOCUMENTS

| | | | |
|---|---|---|---|
| 2005/0012153 A1* | 1/2005 | Ipposhi | 257/347 |
| 2008/0203483 A1* | 8/2008 | Kuroki | 257/368 |
| 2010/0264513 A1 | 10/2010 | Chung | |

\* cited by examiner

*Primary Examiner* — Tran Tran
(74) *Attorney, Agent, or Firm* — Haynes and Boone, LLP

(57) ABSTRACT

Provided is a integrated circuit device and a method for fabricating the same. The integrated circuit device includes a semiconductor substrate having a dielectric layer disposed over the semiconductor substrate and a passive element disposed over the dielectric layer. The integrated circuit further includes an isolation matrix structure, underlying the passive element, wherein the isolation matrix structure includes a plurality of trench regions each being formed through the dielectric layer and extending into the semiconductor substrate, the plurality of trench regions further including an insulating material and a void area.

17 Claims, 10 Drawing Sheets

INTEGRATED CIRCUIT DEVICE AND METHOD OF MANUFACTURING THE SAME

BACKGROUND

Integrated circuits are often being used in various applications and products in place of discrete circuits to reduce cost, and minimize size and complexity. Various integrated circuits which are being integrated in applications and products are being incorporated to operate at the radio frequency (RF) band. These integrated circuits often require passive elements as part of their function. Passive elements may be in the form of on-chip inductors. On-chip inductors are usually coils or spirals of wiring which are patterned in the top level of the integrated circuit. The inductor carries varying current at high operating frequencies which generates a magnetic field that penetrates into the substrate below. The magnetic field induces an eddy current within the substrate, which flows in an opposite direction as the inductor current. The eddy current generates its own magnetic field, which opposes the magnetic field of the inductor, thereby lowering the quality factor (Q) of the inductor. Q is a commonly used indicator of inductor performance in an integrated circuit device. Q varies as a function of frequency and is a measurement of an inductor's relationship between power loss and energy loss. Accordingly, there is a need for a device with a higher Q to improve the performance of integrated circuits that use passive elements.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
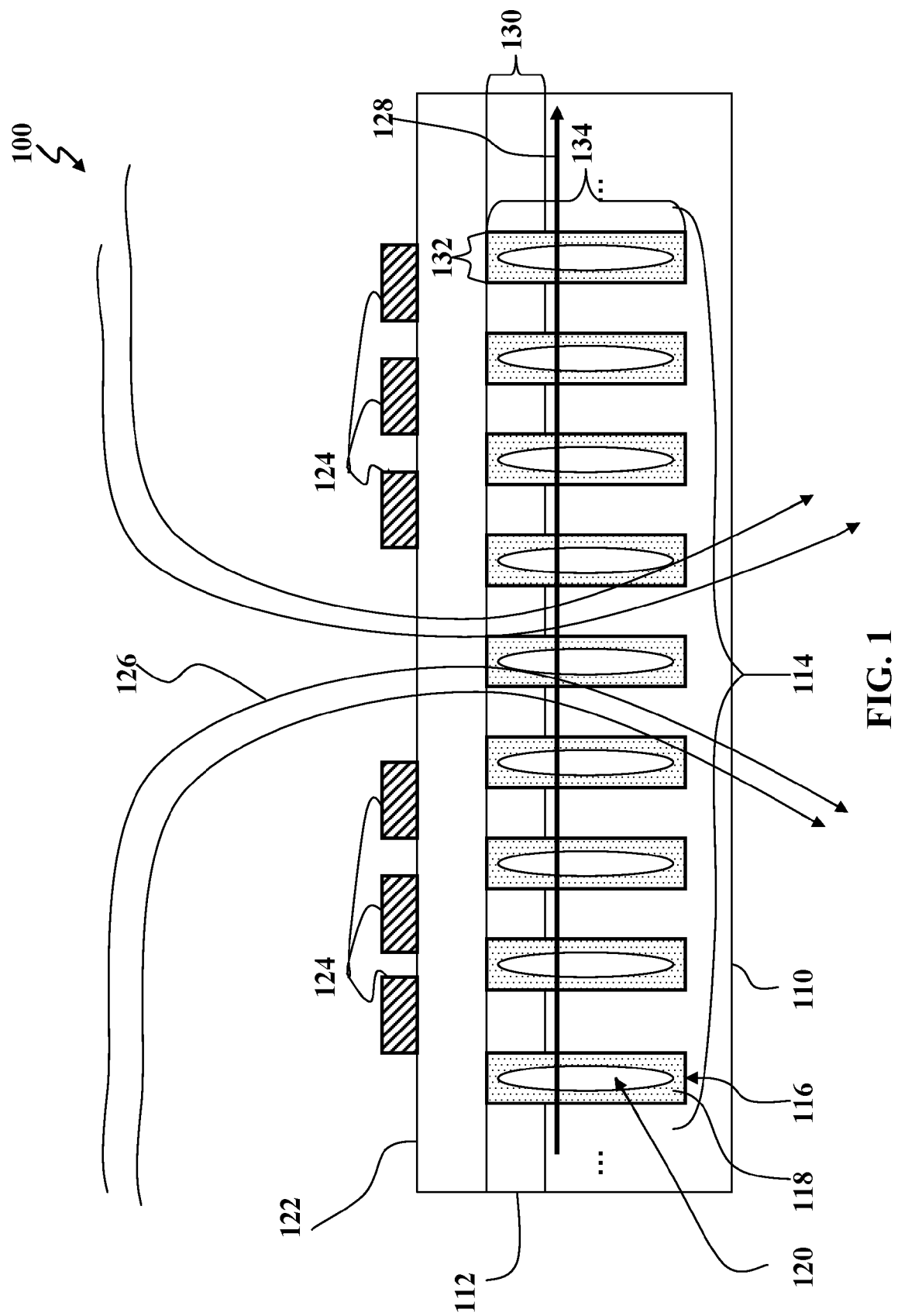
FIG. 1 is a diagrammatic cross sectional view of a integrated circuit device illustrating magnetic fields and eddy current, according to one embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

FIG. 1 is a diagrammatic cross sectional view of an integrated circuit device illustrating magnetic fields and eddy current, according to one embodiment of the present disclosure. In the present embodiment, the integrated circuit device 100 includes a substrate 110. Disposed over the substrate 110 is a dielectric layer 112. The substrate 110 and the dielectric layer 112 also include an isolation matrix structure 114. The isolation matrix structure 114 comprises a plurality of trench regions 116 arranged in a pattern thereon. In the present embodiment, the pattern is a symmetric pattern. The trench regions 116 have a specific width 132 and a specific depth 134. The trench regions 116 include an insulating material 118 within the trench region 116. The insulating material 118 has a void area 120. In the present embodiment, the void area 120 extends through the trench regions 116 of both the substrate 110 and dielectric layer 112. In other embodiments, the void area 120 extends only through the trench regions 116 of the substrate 110.

With further reference to FIG. 1, disposed over the dielectric layer 112 is an interlayer dielectric layer 122 over which a passive element 124 is disposed. In certain embodiments an inter-metal dielectric layer (IMD) may be formed comprising a plurality of metal layer patterns IMD1-IMDn, with IMDn being the upper most layer. The IMD layer may be disposed over the interlayer dielectric layer 122 and under the passive element 124. In the present disclosure, the passive element 124 is shown as an inductor. In alternative embodiments, however, the passive element may be a capacitor, transmission line, filter, balun device, metal-insulator-metal (MiM) device, a substrate noise isolation electromagnetic interference (EMI) device, and other passive elements which may be included within integrated circuits which may benefit from the disclosed embodiment.

During operation, the passive element 124 may carry a varying current at specific operating frequencies which may generate a magnetic field 126 that penetrates into the substrate 110 below. As shown schematically, the magnetic field 126 induces an eddy current 128 which lowers the passive element 124 performance by generating its own magnetic field opposing the magnetic field 126 of the passive element 124, and thereby lower the passive element 124 quality factor (Q). Moreover, the eddy current 128 may also flow into adjacent device regions of the substrate 110 and thereby adversely affect other devices. Generally speaking, as frequency goes higher, the eddy current 128 gets closer to the surface of the substrate 110. The eddy current 128 can be reduced or even eliminated by the isolation matrix structure 114 due to increased resistance and or lower effective capacitance resulting from the patterned trench regions 116 and the void area 120 within, as described below.

In accordance with an embodiment of the present disclosure, the resistance and/or capacitance of the isolation matrix structure 114 may be tuned, for example, by forming a void area 120 within the trench regions 116 at or near the top of the substrate 110, thereby increasing the resistance at or near the surface area of the substrate 110 and inhibiting the eddy current 128 which tends to rise to the top area of the substrate 110 as a function of frequency. In accordance with the present embodiment, forming a void area 120 at the top of the substrate 110 is possible because the trench regions 116 are formed through the dielectric layer 112 and thereby allows the insulating material 118 to close the void area within the trench region 116 of the dielectric layer 112. In certain embodiments of the present disclosure, the dielectric layer 112 may have a thickness 130 in the range of about 0.3 micron to about 0.6 micron. In alternative embodiments, the thickness 130 of the dielectric layer 112 may be in the range of about 0.1 to about 1 micron. Thus, the substrate 110 may have a resulting lower effective dielectric constant because of the void area 120 within the trench region 116 of the substrate 110.

The resistance and/or effective capacitance of the isolation matrix structure 114 may be further tuned, for example, by forming the trench regions 116 at a specified width 132 and depth 133 and thereby inhibit the eddy current 128 at certain frequencies. In certain embodiments of the present disclosure, the trench regions 116 may have the width 132 in the range of about 0.1 micron to about 5 micron and the depth 132 may be about 0.5 micron to about 10 micron. Accordingly, the resistance and effective capacitance of the isolation matrix structure 114 may be tuned to desired specifications and thereby allow one of ordinary skill in the art to inhibit the eddy current 128 within the substrate 110.

Figure 2:
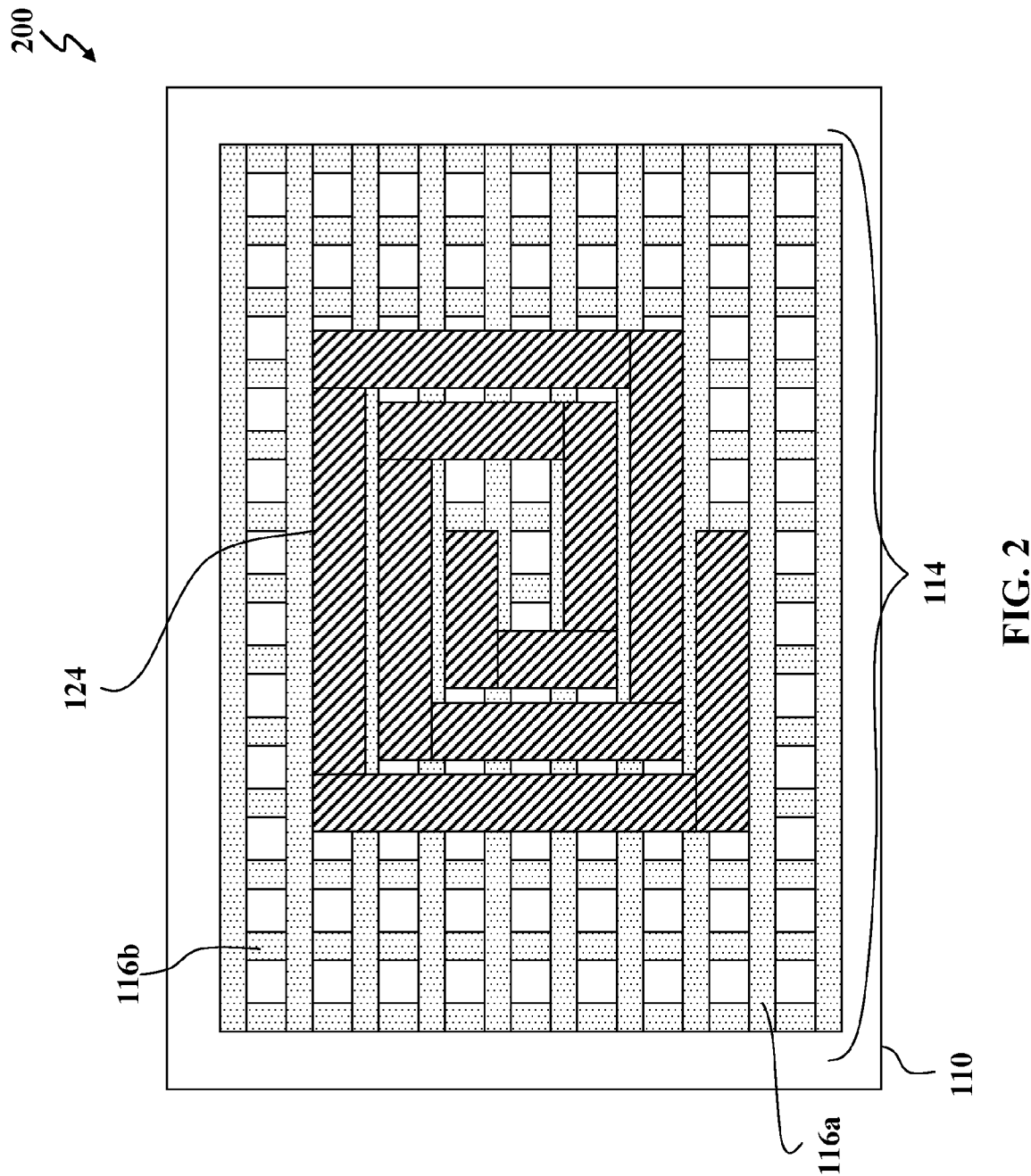
FIG. 2 is a diagrammatic top view of a integrated circuit device, according to some embodiments of the present disclosure.

FIG. 2 is a diagrammatic top view of a integrated circuit device 200, according to some embodiments of the present disclosure. As noted above, the isolation matrix structure 114 may have a plurality of trench regions 116 arranged in a pattern thereon. In FIG. 2, the pattern is represented as a grid pattern which may extend longitudinally beyond the centrally located passive element 124 and thereby define a perimeter surrounding the passive element 124. In the present embodiment, the grid pattern includes a first and a second plurality of segments 116a and 116b, respectively (formed of trench regions 116 of FIG. 1), wherein the first plurality of segments 116a extend in a direction different then the direction of the second plurality of segments 116b. In certain embodiments, the grid pattern may include a plurality of first longitudinal segments displaced from each other and a plurality of second longitudinal segments displaced from each other, the first and second segments being transverse to each other. The grid pattern can be formed in a densely compacted manner thereby increasing the resistance and/or lowering the effective capacitance within the substrate 110. Although only the grid pattern is shown in FIG. 2, the isolation matrix structure 114 is not limited by the shown embodiment and may include other symmetrical patterns arranged to limit the eddy current 128 within the substrate 110.

Figure 3:
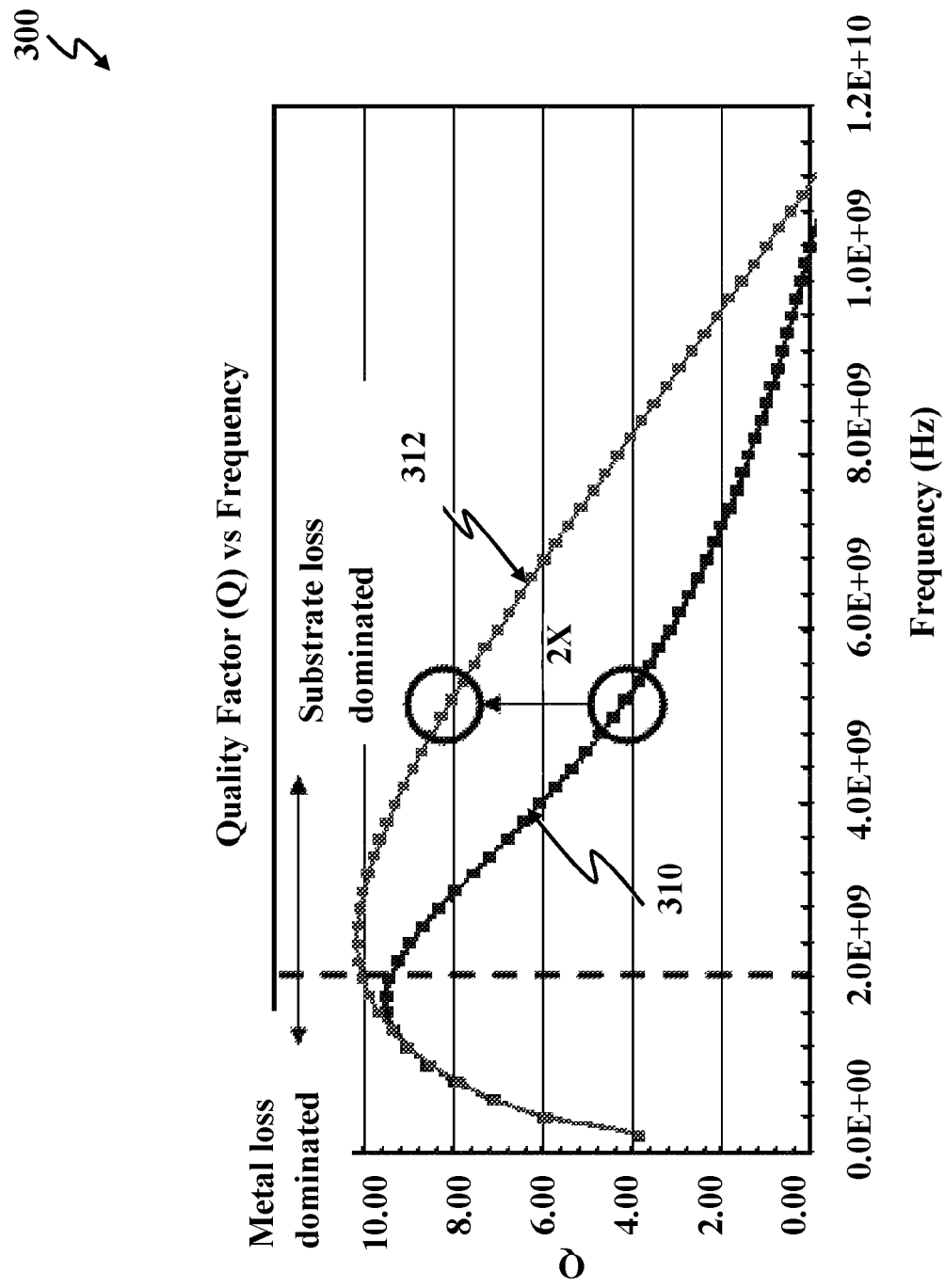
FIG. 3 is a graph illustrating quality factor (Q) for an integrated circuit device according to some embodiments of the present disclosure.
Figure 4:
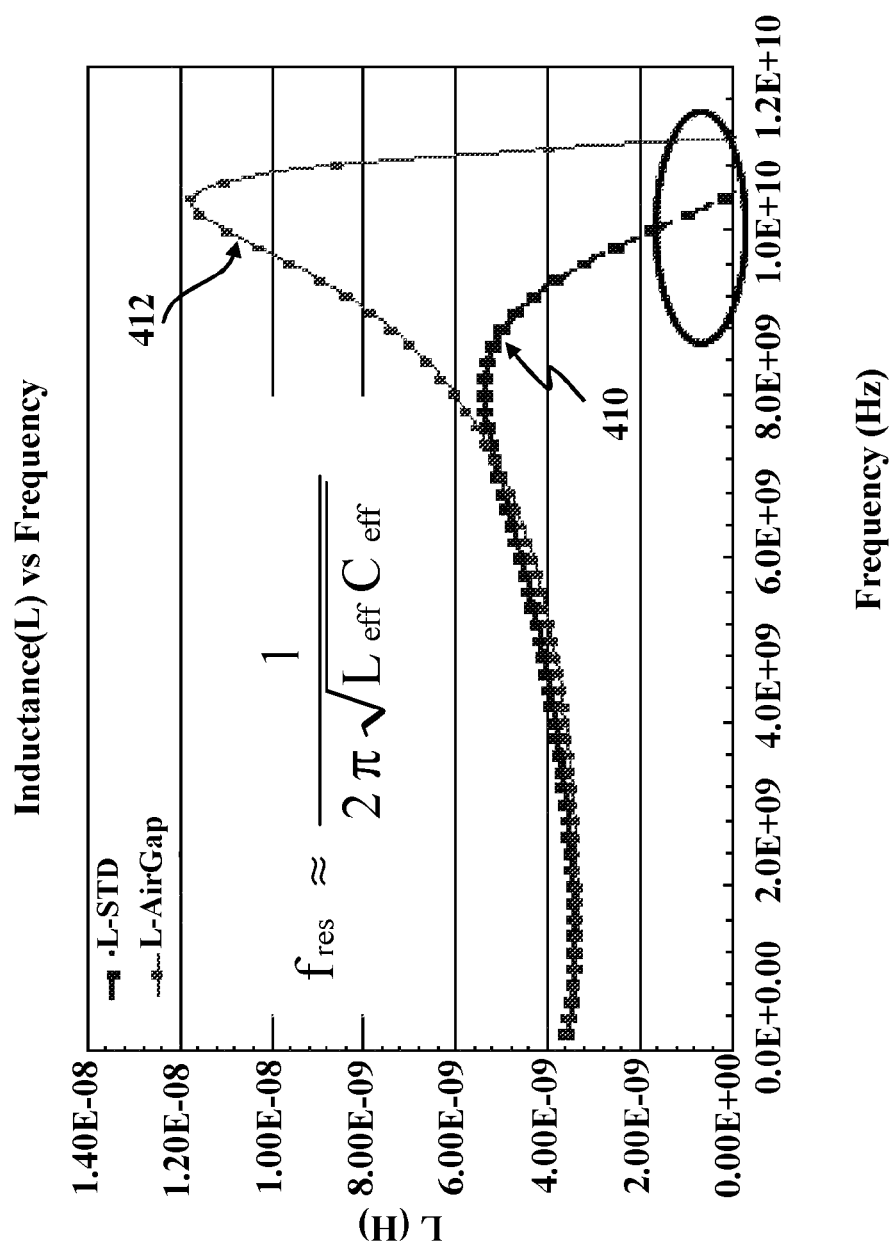
FIG. 4 is a graph illustrating frequency response ($f_{res}$) for an integrated circuit device according to some embodiments of the present disclosure.

FIGS. 3-4 are graphs illustrating quality factor (Q) and frequency response ($f_{res}$) for an integrated circuit device, according to certain embodiments of the present disclosure. As noted above, Q is a commonly used indicator of inductor performance in an integrated circuit device. Q varies as a function of frequency and is a measurement of an inductor's relationship between power loss and energy loss. With reference to FIG. 3, a conventional curve 310 is compared to a improved curve 312 across a frequency range. The conventional curve 310 represents the integrated circuit response without the disclosed embodiments. The improved curve 312 represents the integrated circuit response which results from certain embodiments of the present disclosure. The comparison is made with the integrated circuit devices having the same style inductor and an interlayer dielectric layer having the same thickness. As can be seen, at frequencies above 2 GHz, Q was found to be substantially higher (approximately one hundred percent improved at certain frequencies), due to less power loss. With reference to FIG. 4, a conventional curve 410 is compared across a frequency range to a improved curve 412 which results from certain embodiments of the present disclosure. The frequency response ($f_{res}$) is indicated by zero capacitance L(H) values (the circled portion on the graph). As can be seen, there is a higher $f_{res}$ due to a lower effective capacitance ($C_{eff}$) which results from the isolation matrix structure 116. Therefore, according to the present embodiments, both high Q and high $f_{res}$ may be achieved from the passive element 124.

Figure 5:
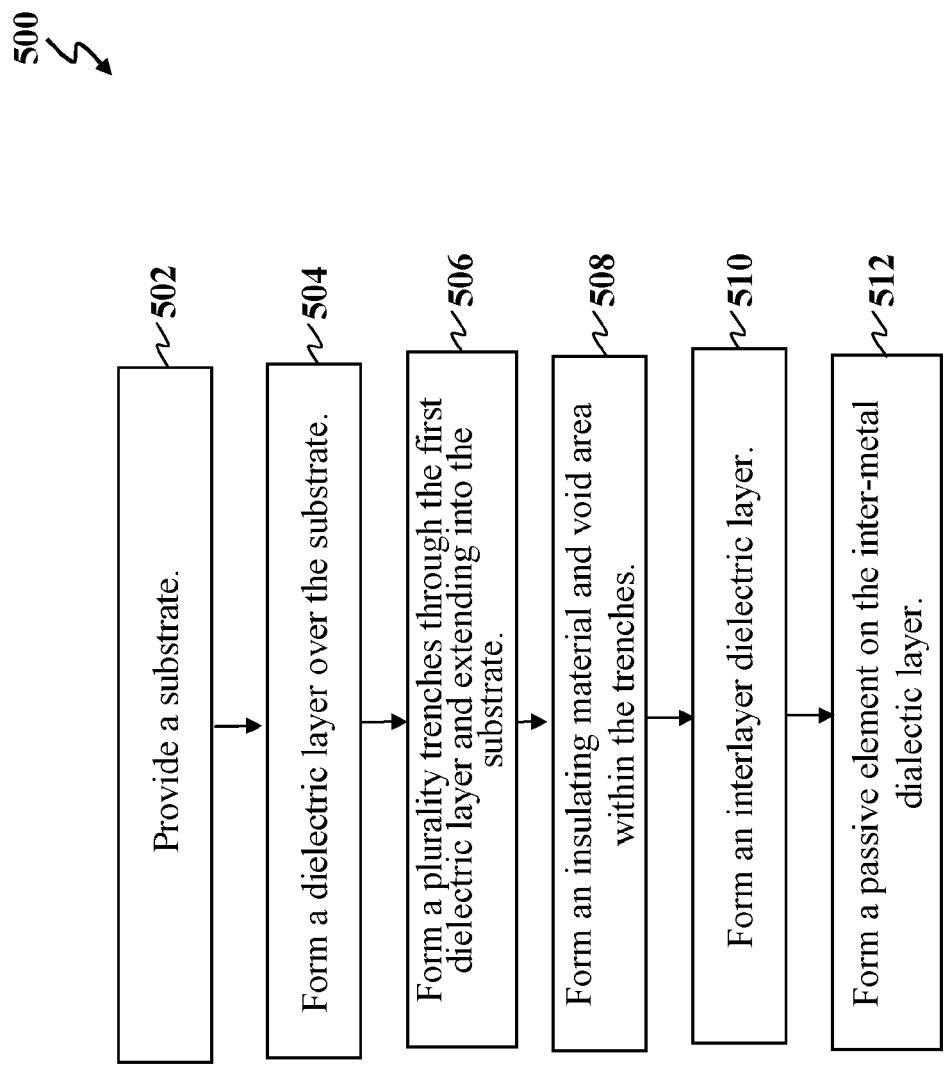
FIG. 5 is a flow chart of a method for fabricating an integrated circuit device according to various aspects of the present disclosure.

FIG. 5 is a flow chart of a method for fabricating a integrated circuit device according to various aspects of the present disclosure. In the present embodiment, the method 500 begins at block 502 where a substrate is provided. At block 504, a dielectric layer is formed over the substrate. At block 506, a plurality of trenches are formed by an etching process on the dielectric layer and extending into the substrate. The etching process may use a hard mask layer. The method continues with block 508 where an insulating material and a void area are formed within the trenches. A chemical mechanical polishing (CMP) process may be used after the formation of the insulating material to smooth the top of the dielectric layer. At block 510, an interlayer dielectric layer is formed over the dielectric layer. The method 500 continues with block 512 where a passive element is formed over the interlayer dialectic layer. Additional steps can be provided before, during, and after the method 500, and some of the steps described can be replaced or eliminated for other embodiments of the method. The discussion that follows illustrates various embodiments of an integrated circuit device that can be fabricated according to the method 500 of FIG. 5.

Figure 6:
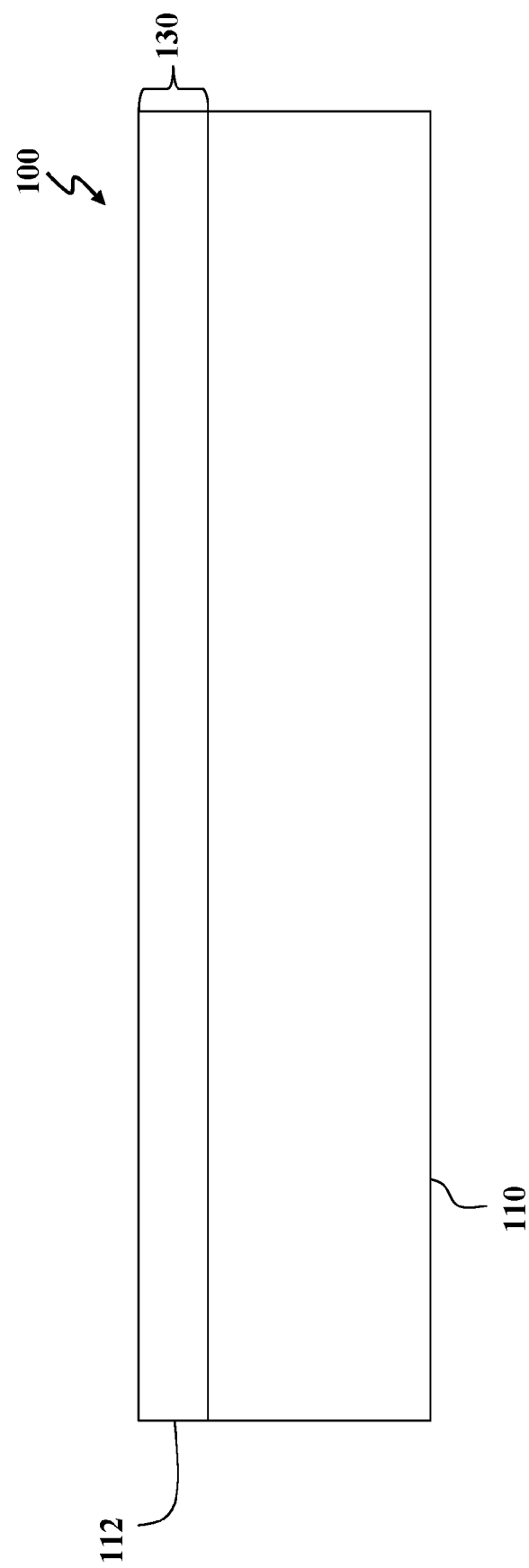
FIGS. 6-10 are diagrammatic cross-sectional views of an integrated circuit device at various fabrication stages of fabrication according to the method of FIG. 5.

FIGS. 6-10 are diagrammatic cross-sectional views of a integrated circuit device at various fabrication stages of fabrication according to the method 500 of FIG. 5. Referring now to FIG. 6, a substrate 110 is provided. In one embodiment, the substrate 110 may be formed of an elemental semiconductor material such as silicon (Si) or germanium (Ge), or an alloy semiconductor such as silicon germanium (SiGe) or silicon carbide (SiC), or a compound semiconductor such as gallium arsenide or indium phosphide, or other suitable semiconductor materials which are well known in the art. A dielectric layer 112 is provided over the substrate 110. The dielectric layer 112 may include silicon oxide (SiO) or other suitable materials. In certain embodiments of the present disclosure, the dielectric layer 112 may have a thickness 130 of about 0.3 micron to about 0.6 micron. In alternative embodiments, the thickness 130 of the dielectric layer 112 may be about 0.1 to about 1 micron.

Figure 7:
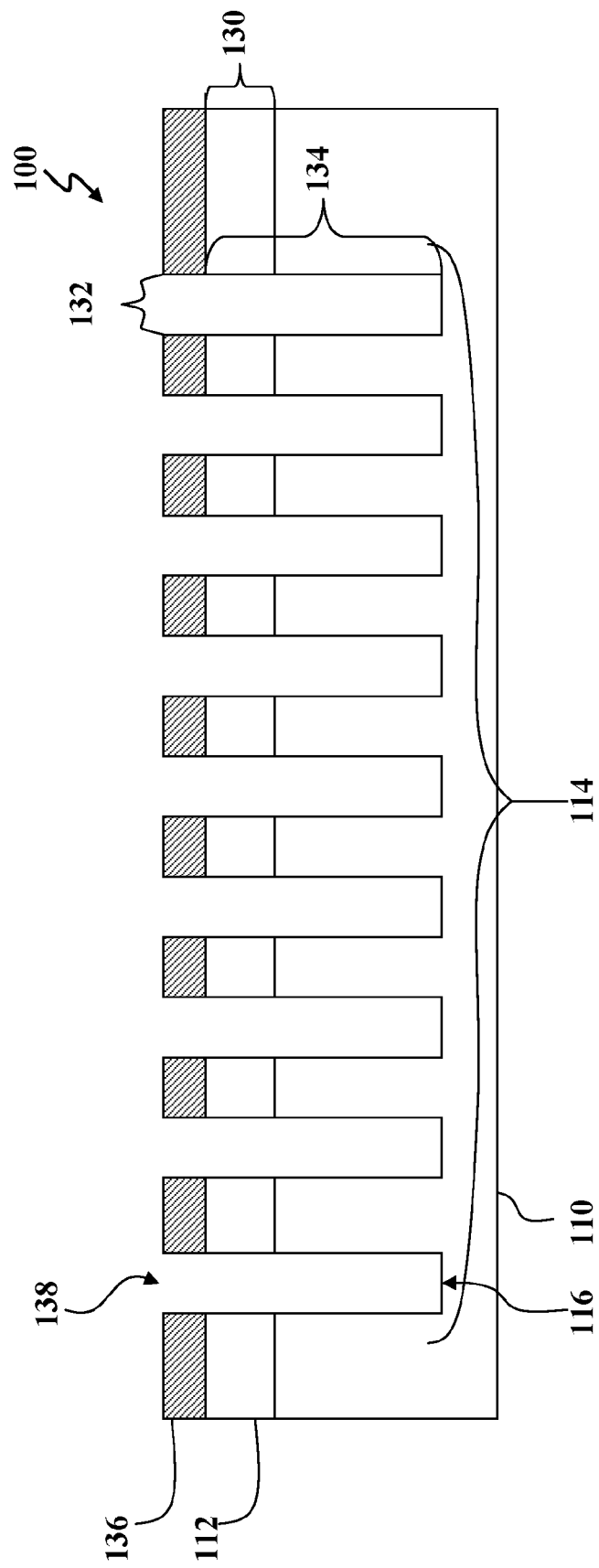

In FIG. 7, a hard mask layer 136 is formed over the dielectric layer 112. In an embodiment of the present disclosure, the hard mask layer 136 may be formed of material that includes silicon nitride (SiN) or silicon oxide (SiO). A plurality of openings 138 may be formed in the hard mask layer 136. Thereafter, the isolation matrix structure 114 may be formed having a plurality of trench regions 116 arranged in a pattern thereon. The trench regions 116 may be formed by etching the dielectric layer 112 and the substrate 110 within the openings 138 of the hard mask layer 136, the plurality of trench regions 116 having a first sidewall and a second sidewall opposite the first sidewall, the first and second sidewalls extending down to a bottom portion of the plurality of trenches. The trench regions 116 are formed at a specified width 132 and depth 133. For example, the trench regions 116 may have the width 130 of about 0.1 micron to about 5 micron, and the depth 132 may be in the range of about 0.5 micron to about 10 micron. In certain embodiments, the etching process for forming the trench regions 116 may be a dry etching process.

Figure 8:
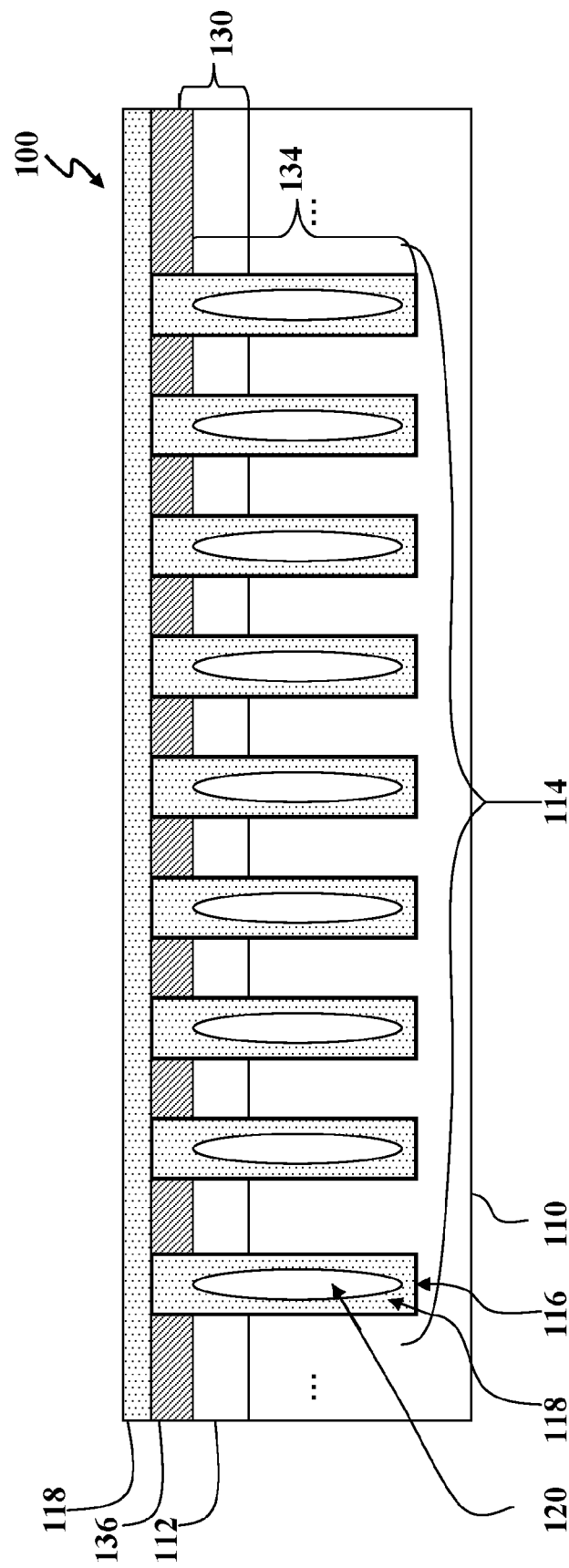

In FIG. 8, an insulating material 118 and a void area 120 are formed within the trench regions 116. The insulating material 118 may be deposited on the first sidewall and on the second sidewall, the insulating material 118 of the first and second sidewall may abut, forming the void area 120 within the trench regions 116. The insulating material 118 may be deposited by a chemical vapor deposition (CVD) process. The CVD process may include low pressure chemical vapor deposition (LPCVD), enhanced chemical vapor deposition (PECVD), rapid thermal chemical vapor deposition (RTCVD) and other known in the art methods of chemical vapor deposition. In one embodiment, the void area 120 extends from the substrate 110 into the dielectric layer 112. In other embodiments, the void area 120 extends only through the substrate 110.

Figure 9:
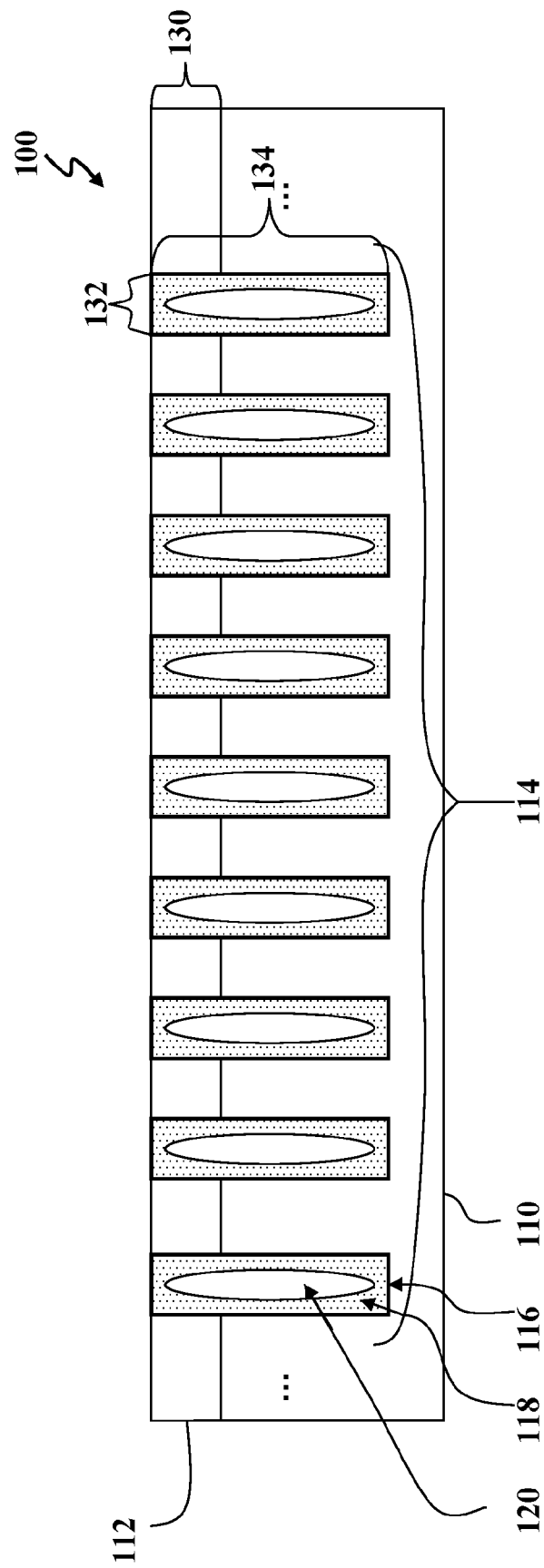

With reference to FIG. 9, the top insulating material 118 is removed by a CMP process which stops at the hard mask layer 136. The hard mask layer 136 is subsequently removed by an etching process. In the present embodiment, the etching process includes a dry etching process. For example, the dry etching process utilizes a pressure ranging from about 5 to about 15 mTorr, a power ranging from about 300 to about 900 W, HBr having a flow rate ranging from about 100 to about 400 sccm, O2/He having a flow rate ranging from about 10 to 40 sccm, Cl2 having a flow rate ranging from about 20 to about 60 sccm, and NF3 having a flow rate ranging from about 1 to about 20 sccm. The etching process may use a hard mask layer, an anti-reflective layer, and a photoresist mask layer, the formation and composition of which are well known in the art.

Figure 10:
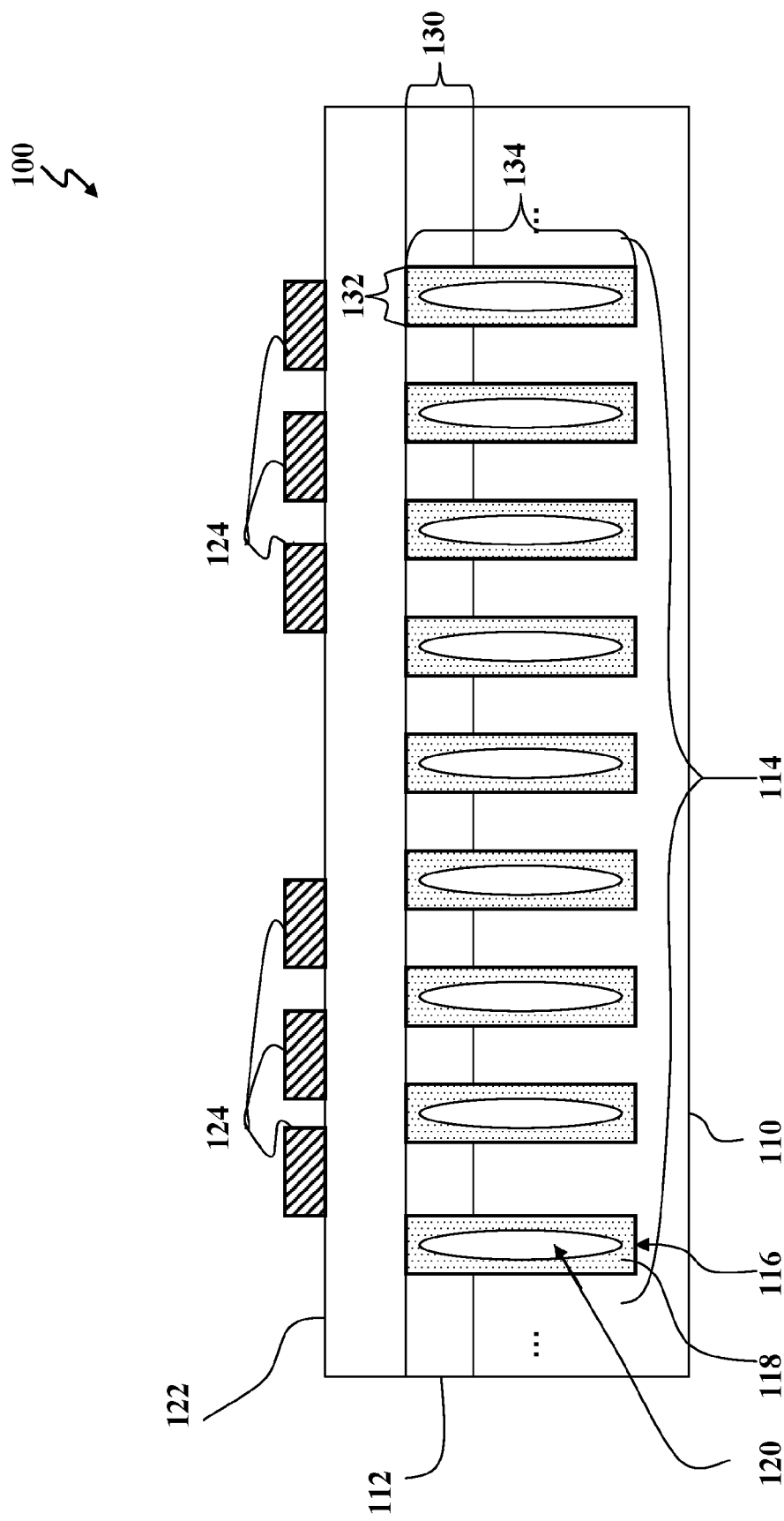

In FIG. 10, a interlayer dielectric layer 122 is formed over the dielectric layer 112, and a passive element 124 is disposed over the interlayer dielectric layer 122. In certain embodiments, a inter-metal dielectric layer (IMD) may be formed between the interlayer dielectric layer 122 and the passive element 124. In the present embodiment, the passive element 124 is shown as an inductor. In alternative embodiments, the passive element may be a capacitor, transmission line, filter, balun device, MiM device, a substrate noise isolation EMI device, and other passive elements which may be included within integrated circuits which would benefit from the disclosed embodiment. In certain embodiments, the interlayer dielectric layer 122 and the inter-metal dielectric layer may include metal structures. For example, the interlayer dielectric layer or the IMD layer may include a conductive screen which may have conductive columns which may be displaced from each other, where each of the columns may include conductive metal elements. Additionally, for example, the IMD layer may be formed comprising a plurality of metal layer patterns IMD1-IMDn, with IMDn being the upper most layer.

Thus, provided is a integrated circuit device. The integrated circuit device includes a semiconductor substrate having a dielectric layer disposed over the semiconductor substrate and a passive element disposed over the dielectric layer. The integrated circuit further includes an isolation matrix structure, underlying the passive element, wherein the isolation matrix structure includes a plurality of trench regions each being formed through the dielectric layer and extending into the semiconductor substrate, the plurality of trench regions further including an insulating material and a void area.

In some embodiments, the void area extends from the semiconductor substrate into dielectric layer. In certain embodiments, the passive element is selected from the group consisting of an inductor, a capacitor, and a combination thereof. In various embodiments, the integrated circuit device includes an interlayer dielectric layer disposed over the dielectric layer. The integrated circuit device may further include an inter-metal dielectric layer disposed between the interlayer dielectric layer and the passive element. In some embodiments, the isolation matrix structure is arranged in a pattern, wherein the pattern is a symmetric pattern. In certain embodiments, the isolation matrix structure extends longitudinally beyond the passive element thereby defining a perimeter surrounding the passive element.

Also provided is a method. The method includes providing a semiconductor substrate and forming a dielectric layer over the semiconductor substrate. The method also includes forming a hard mask layer over the dielectric layer, wherein the hard mask layer has an opening and forming a plurality of trenches by etching the dielectric layer and the semiconductor substrate within the opening of the hard mask layer. The method further includes forming an insulating material within the plurality of trenches, wherein the insulating material includes a void area. Additionally, the method includes forming an interlayer dielectric layer over the dielectric layer and forming a passive element over the interlayer dielectric layer.

In some embodiments, the dielectric layer includes silicon oxide (SiO) and the hard mask layer includes silicon nitride (SiN). In certain embodiments, the method further comprises removing the hard mask layer after forming the insulating material within the plurality of trenches. In various embodiments, the dielectric layer has a thickness such that the void area extends from the semiconductor substrate into the dielectric layer. In some embodiments, the method further comprises forming an inter-metal dielectric layer over the interlayer dielectric layer, wherein the passive element is positioned over the inter-metal dielectric layer. In certain embodiments, the plurality of trenches have a depth in the range of about 0.5 micron to about 10 micron. In further embodiments, the plurality of trenches are arranged in a pattern, the pattern comprising a plurality of first longitudinal segments displaced from each other and a plurality of second longitudinal segments displaced from each other, the first and second segments being transverse to each other, and wherein the pattern is configured to reduce the effective capacitance of the semiconductor substrate.

Also provided is an alternative embodiment of an integrated circuit device. The integrated circuit device includes a semiconductor substrate and a dielectric layer disposed over the semiconductor substrate. The integrated circuit device further includes an interlayer dielectric layer disposed over the dielectric layer and an inter-metal dielectric layer disposed over the interlayer dielectric layer. In addition, the integrated circuit device includes a magnetic flux generating electrical structure disposed over the inter-metal dielectric layer. The integrated circuit device has a plurality of a plurality of trenches arranged in a pattern formed through the dielectric layer and extending into the semiconductor substrate. The integrated circuit device further includes an insulating material disposed within the plurality of trenches and a void area disposed within the insulating material, and wherein the plurality of trenches are configured to inhibit eddy current induced in the semiconductor substrate by a magnetic flux of the magnetic flux generating electrical structure.

In some embodiments, the electrical structure comprises an inductor and wherein the pattern includes a plurality of first segments and a plurality of second segments, wherein the first segments extend in a direction different to a direction of the second segments. In further embodiments, the inductor comprises a material selected from the group consisting of copper (Cu) and aluminum (Al). In further embodiments, the dielectric layer has a thickness in the range of about 0.3 micron to about 0.6 micron and wherein the void area extends from the semiconductor substrate into the dielectric layer. In other embodiments, the plurality of trenches are configured to reduce the effective capacitance within the integrated circuit device.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a semiconductor substrate;
   a dielectric layer disposed over the semiconductor substrate;
   a passive element disposed over the dielectric layer;
   an isolation matrix structure, underlying the passive element, wherein the isolation matrix structure includes a plurality of trench regions each being formed through the dielectric layer and extending into the semiconductor substrate, the plurality of trench regions further including an insulating material; and
   a void area disposed within the plurality of trench regions extending from the semiconductor substrate into the dielectric layer.

2. The integrated circuit device of claim 1 wherein the passive element is selected from the group consisting of an inductor, a capacitor, and a combination thereof.

3. The integrated circuit device of claim 1 further comprising an interlayer dielectric layer disposed over the dielectric layer.

4. The integrated circuit device of claim 3 further comprising an inter-metal dielectric layer disposed between the interlayer dielectric layer and the passive element.

5. The integrated circuit device of claim 1 wherein the isolation matrix structure is arranged in a pattern, wherein the pattern is a symmetric pattern.

6. The integrated circuit device of claim 1 wherein the isolation matrix structure extends longitudinally beyond the passive element thereby defining a perimeter surrounding the passive element.

7. An integrated circuit structure comprising
   a semiconductor substrate;
   a dielectric layer disposed over the semiconductor substrate;
   an interlayer dielectric layer disposed over the dielectric layer;
   an inter-metal dielectric layer disposed over the interlayer dielectric layer;
   a magnetic flux generating electrical structure disposed over the inter-metal dielectric layer;
   a plurality of trenches arranged in a pattern formed through the dielectric layer and extending into the semiconductor substrate;
   an insulating material disposed within the plurality of trenches; and
   a void area disposed within the insulating material,
   wherein the plurality of trenches are configured to inhibit eddy current induced in the semiconductor substrate by a magnetic flux of the magnetic flux generating electrical structure.

8. The integrated circuit device of claim 7 wherein the electrical structure comprises an inductor and wherein the pattern includes a plurality of first segments and a plurality of second segments, wherein the first segments extend in a direction different to a direction of the second segments.

9. The integrated circuit device of claim 8 wherein the inductor comprises a material selected from the group consisting of copper (Cu) and aluminum (Al).

10. The integrated circuit device of claim 7 wherein the dielectric layer has a thickness in the range of about 0.3 to about 0.6 micron and wherein the void area extends from the semiconductor substrate into the dielectric layer.

11. The integrated circuit device of claim 7 wherein the plurality of trenches are configured to reduce the effective capacitance within the integrated circuit device.

12. An integrated circuit device comprising:
    a semiconductor substrate;
    a dielectric layer over the semiconductor substrate;
    a plurality of trenches in the dielectric layer;
    an insulating material within the plurality of trenches, wherein the insulating material includes a void area;
    an interlayer dielectric layer over the dielectric layer; and
    a passive element over the interlayer dielectric layer;
    wherein the dielectric layer has a thickness such that the void area extends from the semiconductor substrate into the dielectric layer.

13. The device of claim 12, wherein the dielectric layer includes silicon oxide (SiO).

14. The device of claim 12 further comprising:
    an inter-metal dielectric layer over the interlayer dielectric layer, wherein the passive element is positioned over the inter-metal dielectric layer.

15. The device of claim 12 wherein the plurality of trenches have a depth in the range of about 0.5 to about 10 micron.

16. The device of claim 12 wherein the plurality of trenches are arranged in a pattern, the pattern comprising a plurality of first longitudinal segments displaced from each other and a plurality of second longitudinal segments displaced from each other, the first and second segments being transverse to each other.

17. The device of claim 16 wherein the pattern is configured to reduce the effective capacitance of the semiconductor substrate.

* * * * *